United States Patent
Cheng et al.

(10) Patent No.: US 11,570,339 B2
(45) Date of Patent: Jan. 31, 2023

(54) PHOTODIODE PACKAGE STRUCTURE WITH SHUTTERS, FORMING METHOD THEREOF, AND WEARABLE DEVICE HAVING THE SAME

(71) Applicant: Lextar Electronics Corporation, Hsinchu (TW)

(72) Inventors: Kai-Hung Cheng, Hsinchu (TW); Fu-Han Ho, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 146 days.

(21) Appl. No.: 17/037,738

(22) Filed: Sep. 30, 2020

(65) Prior Publication Data

US 2022/0103726 A1 Mar. 31, 2022

(51) Int. Cl.
*H01L 27/146* (2006.01)
*H01L 31/18* (2006.01)
*H01L 31/0203* (2014.01)
*H01L 31/0232* (2014.01)
*H04N 5/225* (2006.01)

(52) U.S. Cl.
CPC ..... *H04N 5/2254* (2013.01); *H01L 27/14625* (2013.01); *H01L 27/14643* (2013.01); *H01L 27/14687* (2013.01); *H01L 31/0203* (2013.01); *H01L 31/02327* (2013.01); *H01L 31/18* (2013.01)

(58) Field of Classification Search
CPC ............ H04N 5/2254; H01L 27/14625; H01L 27/14643; H01L 27/14687; H01L 31/0203; H01L 31/02327; H01L 31/18; H01L 31/02325
USPC ........................................................ 257/432
See application file for complete search history.

(56) References Cited

U.S. PATENT DOCUMENTS

| | | | |
|---|---|---|---|
| 8,796,749 B2 | 8/2014 | Liao et al. | |
| 2002/0094604 A1* | 7/2002 | Hayama | H01L 21/4867 257/E21.503 |
| 2016/0358007 A1* | 12/2016 | Chung | H01L 23/15 |
| 2017/0271384 A1* | 9/2017 | Zheng | H01L 27/14623 |
| 2019/0049650 A1* | 2/2019 | Keränen | H05K 1/0274 |
| 2020/0075652 A1* | 3/2020 | Chen | H01L 27/14645 |
| 2021/0057479 A1* | 2/2021 | Mizuta | H01L 27/1464 |

FOREIGN PATENT DOCUMENTS

| TW | I597476 B | 9/2017 |
|---|---|---|
| TW | I624043 B | 5/2018 |
| TW | I647437 B | 1/2019 |

* cited by examiner

*Primary Examiner* — Duy T Nguyen
(74) *Attorney, Agent, or Firm* — CKC & Partners Co., LLC (57) ABSTRACT

According to the disclosure, a photodiode package structure is provided. The photodiode package structure includes a substrate, a photodiode chip on the substrate, a plurality of shutters above the photodiode chip, and a seal member covering the substrate and the photodiode chip, in which the shutters are embedded in the seal member.

19 Claims, 10 Drawing Sheets

PHOTODIODE PACKAGE STRUCTURE WITH SHUTTERS, FORMING METHOD THEREOF, AND WEARABLE DEVICE HAVING THE SAME

BACKGROUND

Field of Invention

The present disclosure relates to a photodiode package. More particularly, the present disclosure relates to a wearable device having the photodiode package and method of forming the photodiode package.

Description of Related Art

A photodiode is designed to transform light energy into electric energy, for example, a solar cell. A photon of the light may reach the photodiode and excite an electron leading to the current of the photodiode. The intensity of the current corresponds to the energy and the amount of the light detected by the photodiode. Therefore, the electrical signal and the calculation of a device with a photodiode are determined by the light detection ability of the photodiode.

SUMMARY

The disclosure provides a photodiode package structure including a substrate, a photodiode chip on the substrate, a plurality of shutters above the photodiode chip, and a seal member covering the substrate and the photodiode chip, in which the shutters are embedded in the seal member.

The disclosure provides a method of forming a photodiode package structure. The method includes providing a substrate and a photodiode chip on the substrate. The method includes forming a seal member, which includes a plurality of trenches above the photodiode chip, covering the photodiode chip and the substrate. The method includes forming a non-transparent layer on the seal member and in the trenches. The method includes curing the non-transparent layer. The method includes removing portions of the non-transparent layer on a surface of the seal member, and the remained portions of the non-transparent layer in the trenches form a plurality of shutters above the photodiode chip.

The disclosure provides a wearable device including a carrier, a light source on the carrier, and a photodiode package structure adjacent to the light source on the carrier. The photodiode package structure includes a photodiode chip, a seal member covering the photodiode chip, and a plurality of shutters embedded in the seal member above the photodiode chip.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 5A-7C are cross-sectional views of a photodiode package structure at intermediate stages of the forming method according to some embodiments of the disclosure;

DETAILED DESCRIPTION

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A photodiode package structure generally includes a seal member on a photodiode chip to isolate the photodiode chip from the extrinsic factors, for example, moistures and particles in the air. The seal member is formed with a flat surface above the photodiode chip. The light then penetrates through the seal member and is detected by the photodiode chip. The flat seal member allows the light with different angles to penetrate thought it.

A flat seal member on a photodiode chip not only allows the desired light to reach the photodiode chip but also allows the ambient light to be detected by the photodiode chip. The undesired ambient light leads to extra light signals. For a wearable device, this extra light signals cause errors in calculation. Therefore, a photodiode package structure which may avoid the detection of the ambient light is preferred for the wearable device.

Figure 1:
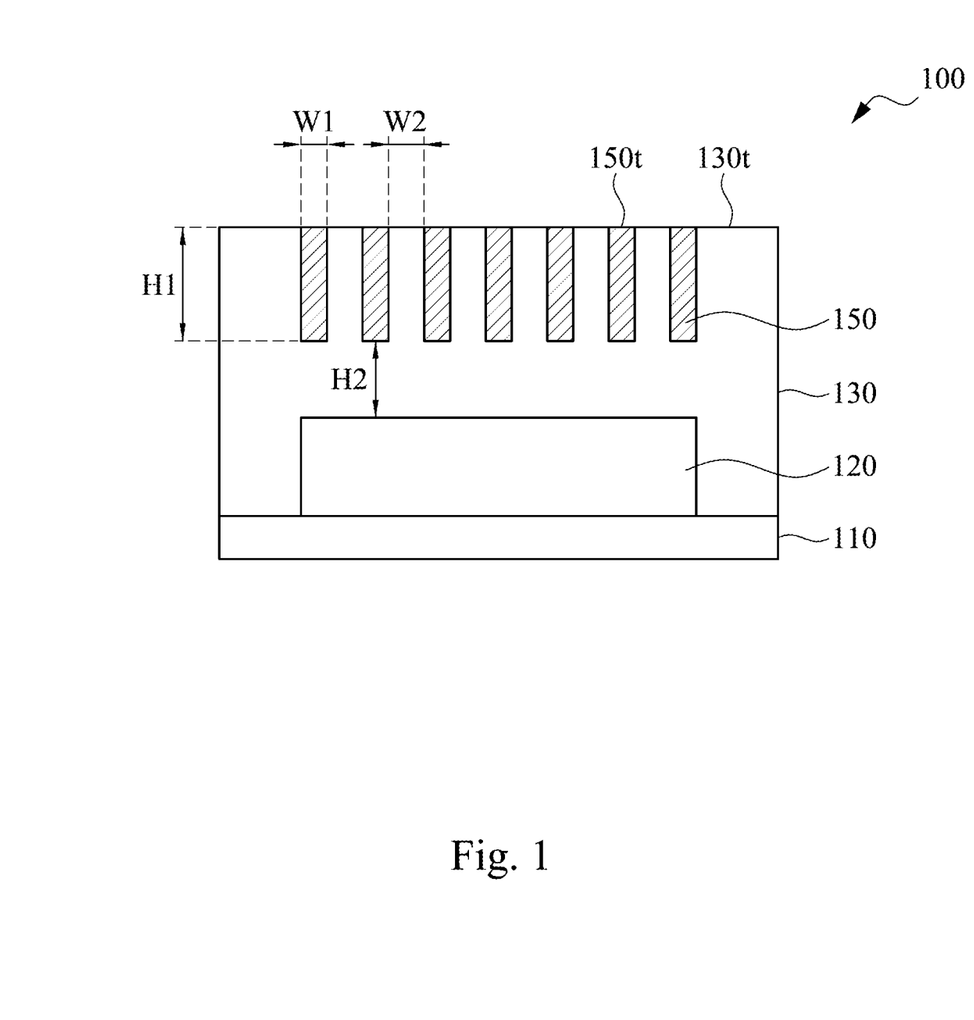
FIG. 1 is a cross-sectional view of a photodiode package structure according to one embodiment of the disclosure.

FIG. 1 illustrates a cross-sectional view of a photodiode package structure 100 according to one embodiment of the disclosure. The photodiode package structure 100 includes a substrate 110, a photodiode chip 120 on the substrate 110, and a seal member 130 covering the substrate 110 and the photodiode chip 120. The seal member 130 may include transparent materials such that the light penetrates through the seal member 130 and reaches the photodiode chip 120. In some embodiments, there may be other elements or devices included in the photodiode package structure 100, and those modifications are within the scope of the present disclosure.

As shown in FIG. 1, the photodiode package structure 100 includes a plurality of shutters 150 above the photodiode chip 120. The shutters 150 are embedded in the seal member 130. In some embodiments, a top surface 150t of the shutters 150 may be coplanar with a top surface 130t of the seal member 130. In other words, the shutters 150 and the seal member 130 may form a planar top surface of the photodiode package structure 100.

The shutters 150 are arranged to block the undesired light from reaching the photodiode chip 120. Therefore, the shutters 150 include non-transparent materials that do not allow the transmittance of the light. In some embodiments, the shutters 150 may include a non-transparent UV resin such as acrylate resin or epoxy resin, a non-transparent plastic material, or a non-transparent metal.

The size of the shutters 150 may depend on the size of the photodiode package structure 100. In some embodiments, a height H1 of each of the shutters 150 may be in a range of 0.1 mm to 0.5 mm, and a width W1 of each of the shutters 150 may be in a range of 20 μm to 50 μm.

Spaces W2 between adjacent two of the shutters 150 may be arranged to allow the penetration of the desired light. In addition, gaps H2 between the shutters 150 and the photodiode chip 120 may be arranged to remain the light detection ability of the photodiode chip 120. In some embodiments, a space W2 between adjacent two of the shutters 150 may be in a range of 0.1 mm to 0.5 mm, and a gap between the shutters 150 and the photodiode chip 120 may be in a range of 0.1 mm to 0.5 mm.

In FIG. 1, the shutters 150 are arranged perpendicular to the top surface 130t of the seal member 130. In other words, the angle between the shutters 150 and the vertical direction of the top surface 130t of the seal member 130 is 0°. According to some embodiments, the angle may not be 0° between the shutters 150 and the vertical direction of the top surface 130t of the seal member 130. The angle between the shutters 150 and the vertical direction of the top surface 130t of the seal member 130 may depend on the design of the photodiode package, which will be discussed in further detail below.

Figure 2:
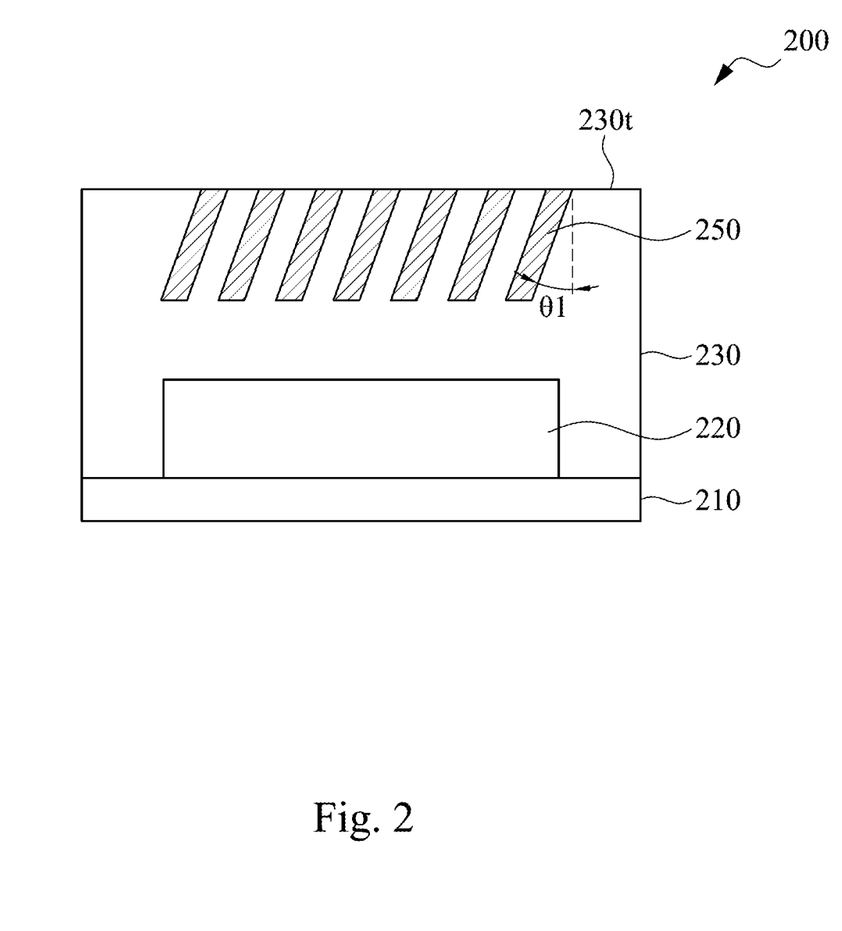
FIG. 2 is a cross-sectional view of a photodiode package structure according to another embodiment of the disclosure.

FIG. 2 illustrates a cross-sectional view of a photodiode package structure 200 according to another embodiment of the disclosure. The photodiode package structure 200 includes a substrate 210, a photodiode chip 220, and a seal member 230 which are similar to the corresponding elements of the photodiode package structure 100 in FIG. 1, and these details will not be repeated herein.

As shown in FIG. 2, the photodiode package structure 200 includes a plurality of shutters 250 above the photodiode chip 220. The shutters 250 including non-transparent materials are embedded in the seal member 230. The difference between the shutters 250 in FIG. 2 and the shutters 150 in FIG. 1 is that the direction of the shutters 250 is not perpendicular to the top surface 230t of the seal member 230. An angle 81 is defined between the shutters 250 and the vertical direction of the top surface 230t of the seal member 230. In some embodiments, the angle 81 may be larger than 0°. In some embodiments, the angle 81 may be in a range of 0° to 30°.

The light detected by the photodiode chip 220 may be determined by the angle 81. As the angle 81 is smaller, the light more perpendicular to the top surface 230t of the seal member 230 is easier to penetrate through the gaps between the shutters 250 and reach the photodiode chip 220. As the angle 81 is larger, the light more parallel to the top surface 230t of the seal member 230 is easier to penetrate through the gaps between the shutters 250 and reach the photodiode chip 220. In other words, when the angle 81 is larger, the light with a smaller angle between the light and the top surface 230t of the seal member 230 is easier to reach the photodiode chip 220.

In FIG. 2, the shutters 250 are arranged inclining toward the right side of the photodiode package structure 200 or to be referred as "right-rotated". Therefore, more light from the right side of the photodiode package structure 200 may penetrate through the seal member 230 and received by the photodiode chip 220 compared to the left side. According to some embodiments, the inclining of the shutters 250 may not be toward the right side. The direction of the inclining of the shutters 250 may depend on the design of the photodiode package, which will be discussed in further detail below.

Figure 3:
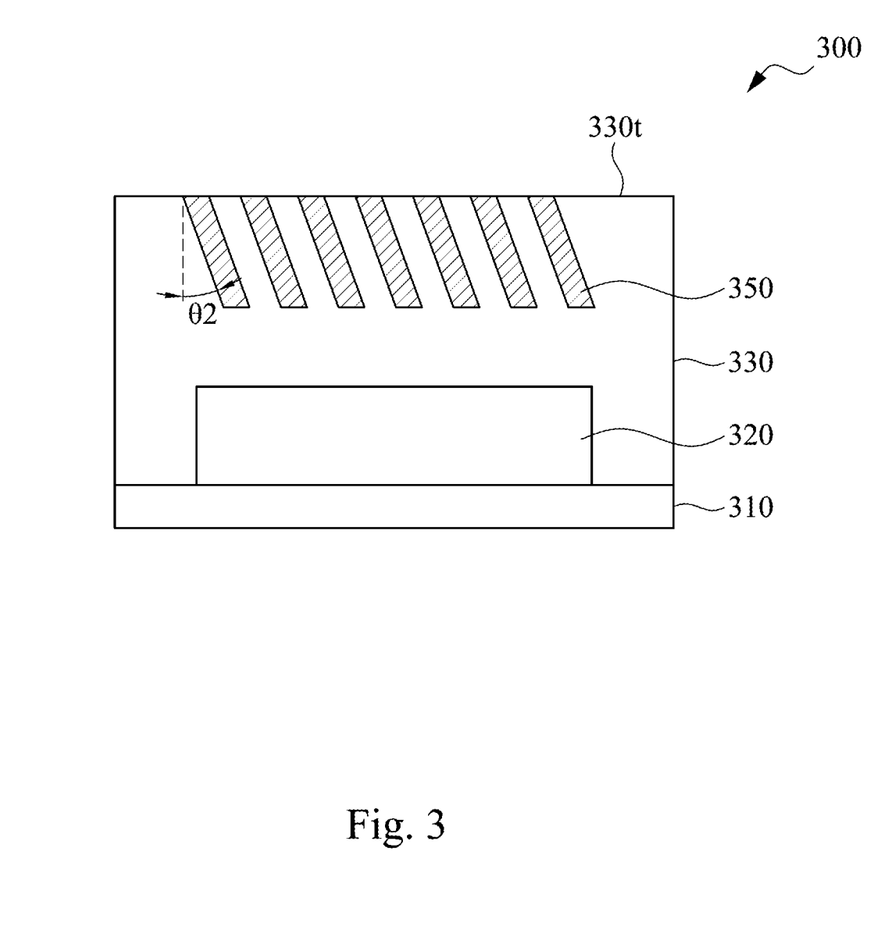
FIG. 3 is a cross-sectional view of a photodiode package structure according to another embodiment of the disclosure.

FIG. 3 illustrates a cross-sectional view of a photodiode package structure 300 according to another embodiment of the disclosure. The photodiode package structure 300 includes a substrate 310, a photodiode chip 320, and a seal member 330 which are similar to the corresponding elements of the photodiode package structure 200 in FIG. 2, and these details would not be repeated herein.

As shown in FIG. 3, the photodiode package structure 300 includes a plurality of shutters 350 above the photodiode chip 320. An angle 82 is defined between the shutters 350 and the vertical direction of the top surface 330t of the seal member 330. In some embodiments, the angle 82 may be larger than 0°. In some embodiments, the angle 82 may be in a range of 0° to 30°. The difference between the shutters 350 in FIG. 3 and the shutters 250 in FIG. 2 is that the shutters 350 incline toward the left side of the photodiode package structure 300 or to be referred as "left-rotated". As a result, more light from the left side of the photodiode package structure 300 may penetrate through the seal member 330 and received by the photodiode chip 320 compared to the right side.

Figure 4:
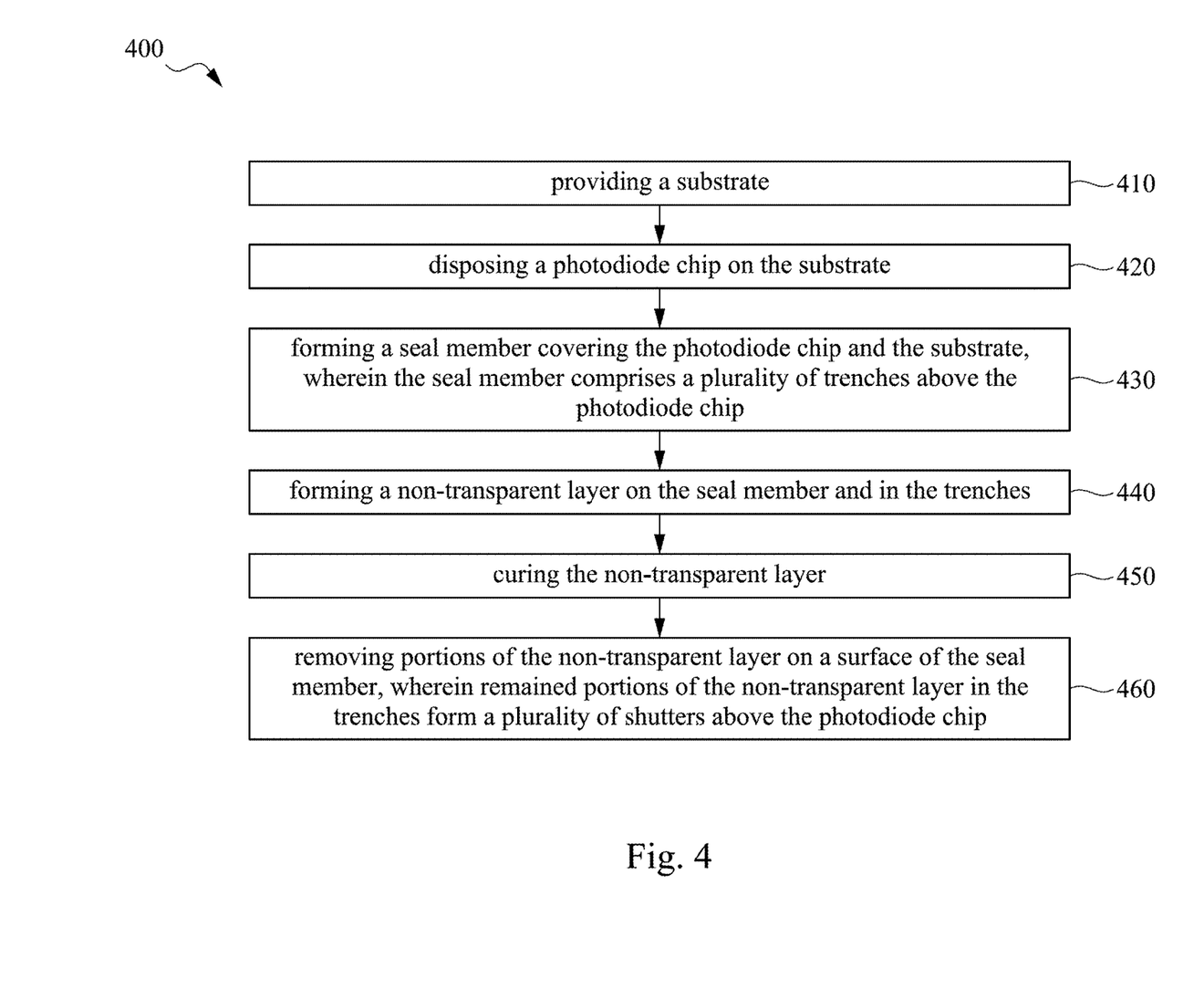
FIG. 4 is a flow chart of a method of forming a photodiode package structure according to some embodiments of the disclosure.

FIG. 4 illustrates a flow chart of a method 400 of forming a photodiode package structure according to some embodiments of the disclosure. For example, the photodiode package structure may be one of the photodiode package structures 100, 200, and 300 in FIG. 1 to FIG. 3, respectively. Accordingly, it is understood that additional operations may be provided before, during, and after the method 400. In some embodiments, operations of the method 400 may be associated with cross-sectional views of a photodiode package structure at various stages as shown in FIGS. 5A-7C, respectively, which will be discussed in further detail below.

Figure 5A:
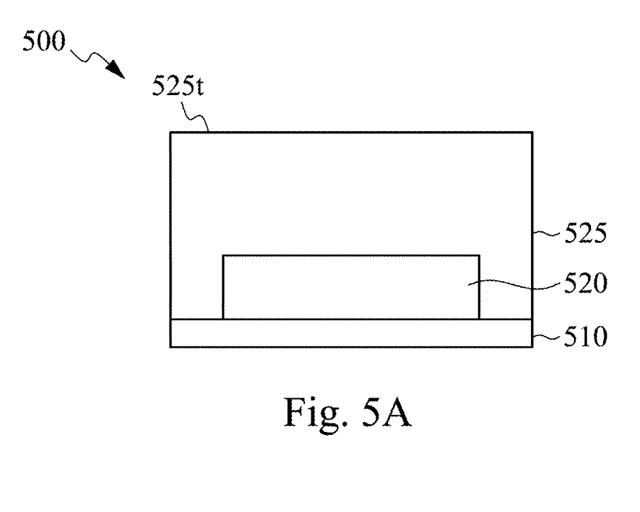
Figure 5B:
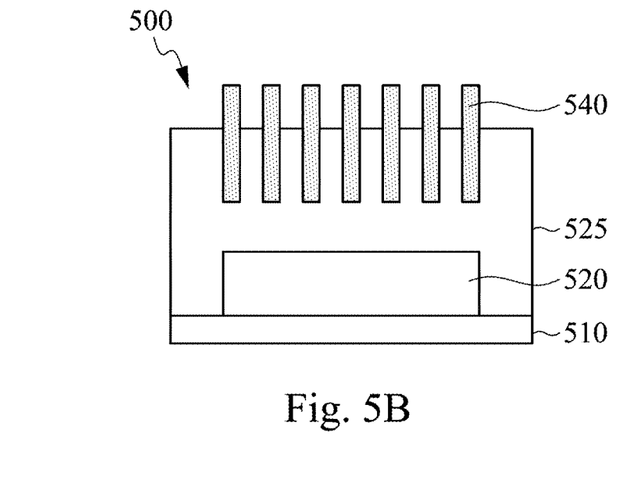
Figure 5C:
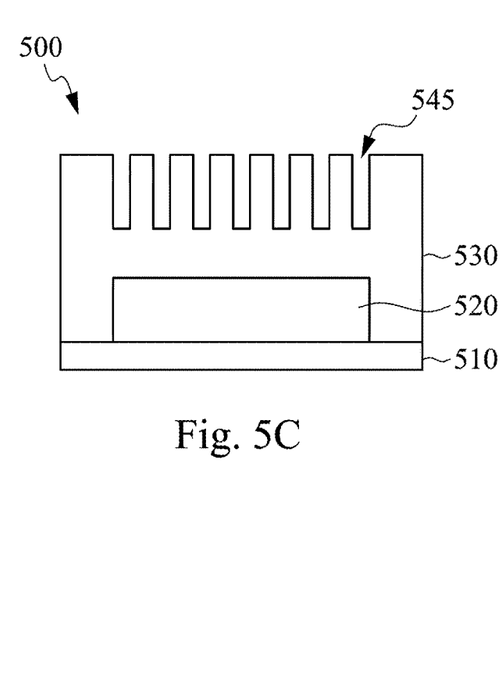

The method 400 starts with operation 410 of providing a substrate. The method 400 continues to operation 420 of disposing a photodiode chip on the substrate. The method 400 continues to operation 430 of forming a seal member covering the photodiode chip and the substrate. Corresponding to operation 410 to operation 430, FIGS. 5A-5C are cross-sectional views of a photodiode package structure 500 at intermediate stages of the method 400 according to some embodiments. As shown in FIG. 5A, the photodiode package structure 500 includes a substrate 510 and a photodiode chip 520 disposed on the substrate 510. A flat transparent sealing material 525 is formed on the photodiode chip 520 and the substrate 510. The flat transparent sealing material 525 may cover the photodiode chip 520 and the substrate 510, which includes forming a planar top surface 525t.

As shown in FIG. 5B and FIG. 5C, a plurality of trenches 545 are formed in the photodiode package structure 500 by cutting the flat transparent sealing material 525. In some embodiments, the flat transparent sealing material 525 may be cut by a group of blades 540 to form the trenches 545 in the flat transparent sealing material 525. In some embodiments, the flat transparent sealing material 525 may be cut repeatedly with one blade 540. The flat transparent sealing material 525 with the trenches 545 is then referred as the seal member 530 of the photodiode package structure 500. In some embodiments, the trenches 545 may be formed above the photodiode chip 520.

Figure 6A:
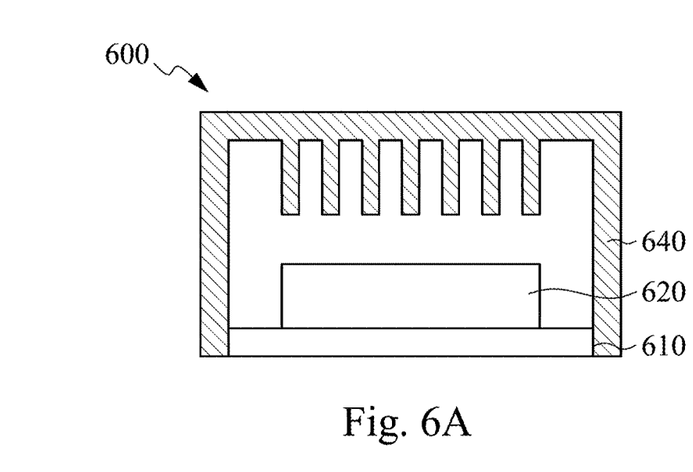
Figure 6B:
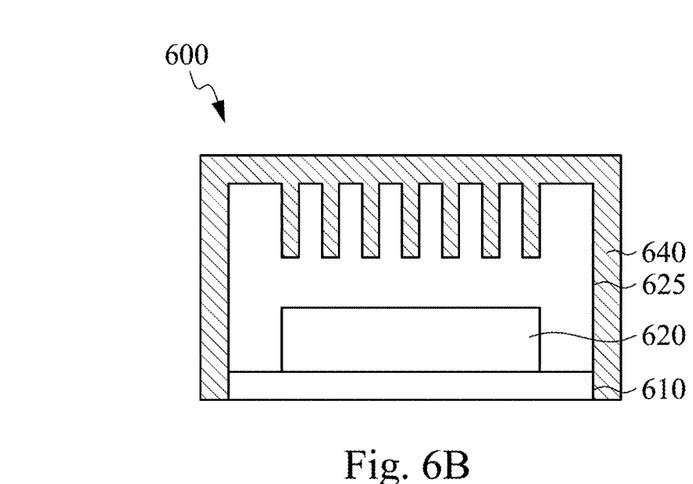
Figure 6C:
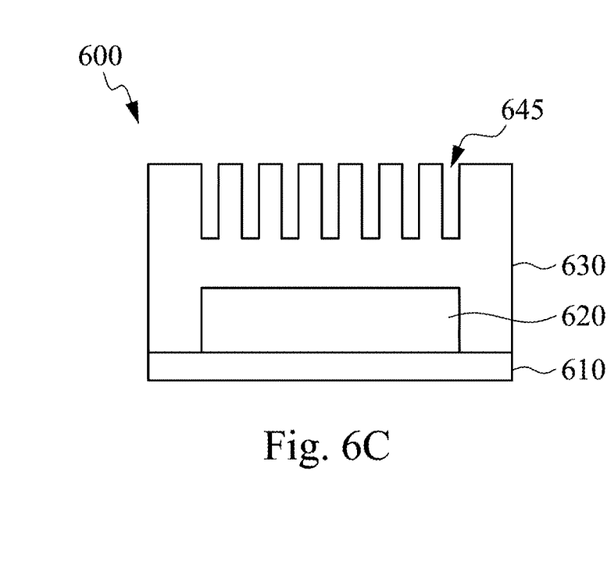

Corresponding to operation 410 to operation 430, FIGS. 6A-6C are cross-sectional views of a photodiode package structure 600 at intermediate stages of the method 400 according to some other embodiments. As shown in FIG. 6A, the photodiode package structure 600 includes a substrate 610 and a photodiode chip 620 disposed on the substrate 610. The substrate 610 and the photodiode chip 620 are placed in a mold 640.

As shown in FIGS. 6B and 6C, the transparent sealing material 625 is injected in the mold 640. The mold 640 may include a plurality of comb teeth corresponding to the trenches 645 (as shown in FIG. 6C) above the photodiode chip 620. Therefore, a plurality of trenches 645 are formed in the transparent sealing material 625 covering the photodiode chip 620 and the substrate 610 after the removing of the mold 640. The transparent sealing material 625 with the trenches 645 is then referred as the seal member 630 of the photodiode package structure 600. In some embodiments, the trenches 645 may be formed above the photodiode chip 620.

The sizes of the trenches 545 and the trenches 645 may depend on the sizes of the photodiode package structures 500 and 600. In some embodiments, the height and the width of the trenches 545 and the trenches 645 may be similar to the shutters 150 in FIG. 1, and the gaps or spaces between the elements may be similar to the photodiode package structure 100. For example, the width of the trenches 545 may be in a range of 20 μm to 50 μm, and the space between adjacent two of the trenches 545 may be in a range of 0.1 mm to 0.5 mm.

Additionally, the trenches 545 and the trenches 645 respectively in the seal member 530 and the seal member 630 may include an angle between the trenches and the vertical direction of the top surface of the seal member. In some embodiments, the angle between the trenches and the vertical direction of the top surface of the seal member is in a range of 0° to 30°.

Figure 7A:
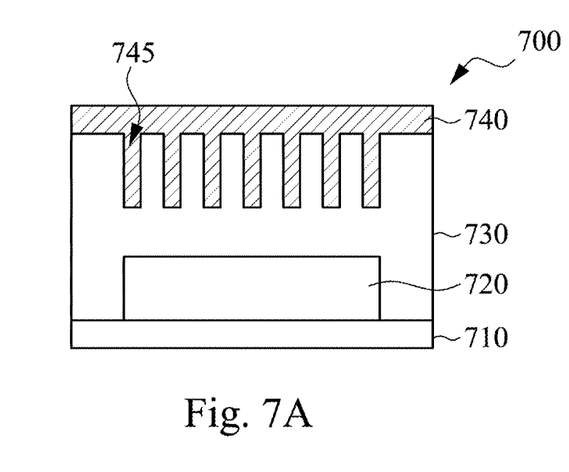

The method 400 continues to operation 440 of forming a non-transparent layer on the seal member and in the trenches. Corresponding to operation 440, FIG. 7A is a cross-sectional view of a photodiode package structure 700 at one intermediate stage of the method 400 according to some embodiments. The photodiode package structure 700 may be provided as the photodiode package structure 500 (as shown in FIG. 5C), the photodiode package structure 600 (as shown in FIG. 5C), or other photodiode package structures with trenches in the seal member.

A non-transparent layer 740 is formed on the seal member 730 and in the trenches 745. The trenches 745 are filled with the non-transparent layer 740 to latter form the shutters embedded in the seal member 730. In some embodiments, the non-transparent layer 740 may include a non-transparent UV resin such as acrylate resin or epoxy resin, a non-transparent plastic material, or a non-transparent metal.

Figure 7B:
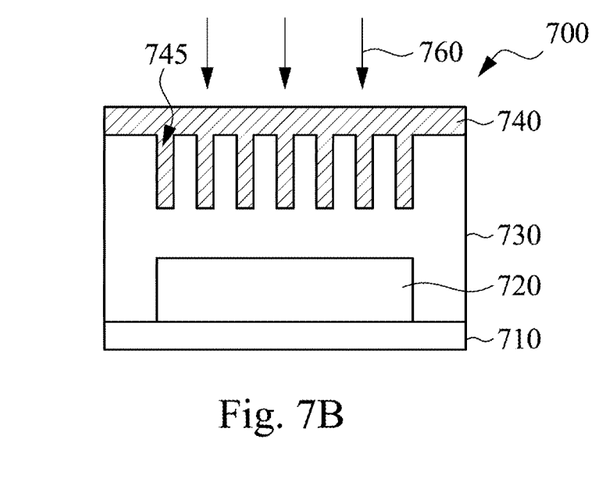

The method 400 continues to operation 450 of curing the non-transparent layer. Corresponding to operation 450, FIG. 7B is a cross-sectional view of a photodiode package structure 700 at one intermediate stage of the method 400 according to some embodiments. The non-transparent layer 740 on the seal member 730 and in the trenches 745 is cured by a light source 760 for further modifications. In some embodiments, the light source 760 may be a UV light source.

Figure 7C:
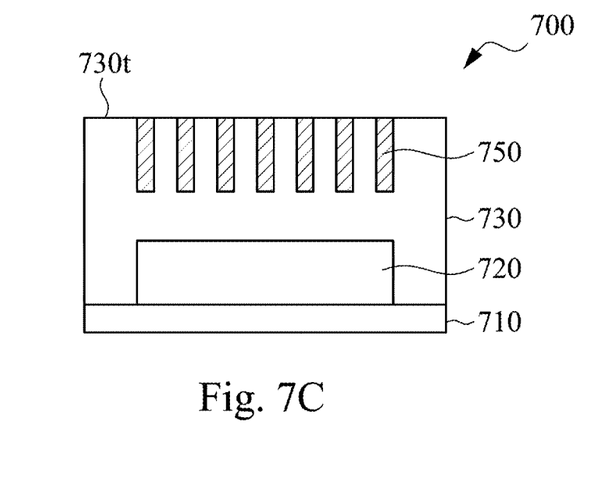

The method 400 continues to operation 460 of removing portions of the non-transparent layer on a top surface of the seal member. Corresponding to operation 460, FIG. 7C is a cross-sectional view of a photodiode package structure 700 at one intermediate stage of the method 400 according to some embodiments. As shown in FIG. 7B and FIG. 7C, the non-transparent layer 740 on the top surface 730t of the seal member 730 is removed while the non-transparent layer 740 in the trenches 745 is remained. The remained portions of the non-transparent layer 740 in the trenches 745 form a plurality of shutters 750 embedded in the seal member 730.

Figure 8:
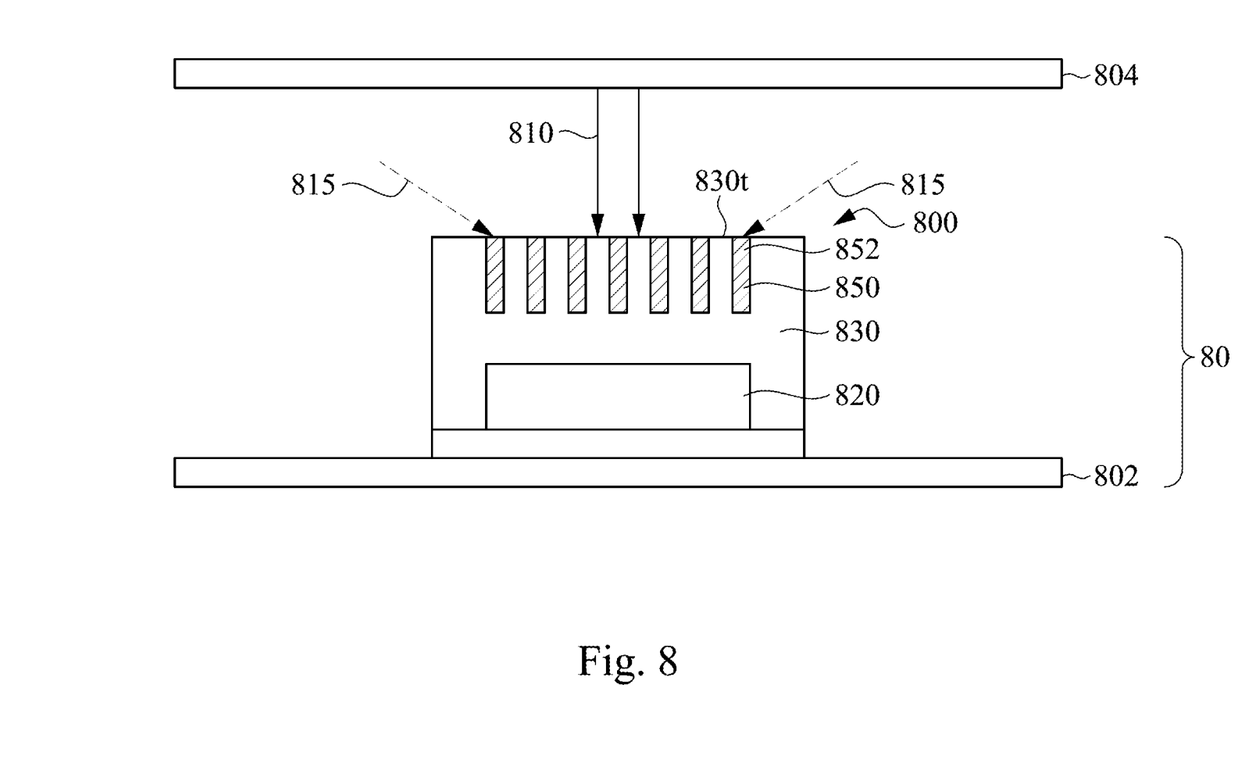
FIG. 8 is a cross-sectional view of a wearable device according to one embodiment of the disclosure.

FIG. 8 illustrates a cross-sectional view of a wearable device according to one embodiment of the disclosure. A photodiode package structure 800 with the shutters 850 on a carrier 802 is provided as a part of the wearable device 80. The photodiode package structure 800 is similar to the photodiode package structure 100 in FIG. 1, in which the shutters 850 are perpendicular to the top surface 830t of the seal member 830. Each of the shutters 850 also includes a first end 852 coplanar with the top surface 830t of the seal member 830.

The light 810 reflected by the plane 804 and the light 815 reach the photodiode package structure 800. As shown in FIG. 8, the light 810 is perpendicular to the top surface 830t of the seal member 830 and is able to penetrate between the shutters 850. In other words, the light 810 with a small angle between the light 810 and the direction of the shutters 850 is able to be received by the photodiode chip 820. Compared to the light 810, the light 815 with a large angle between the light 815 and the direction of the shutters 850 is blocked by the shutters 850. In some embodiments, the light 815 may be the ambient light that leads to the error of the calculation of the wearable device 80.

Figure 9:
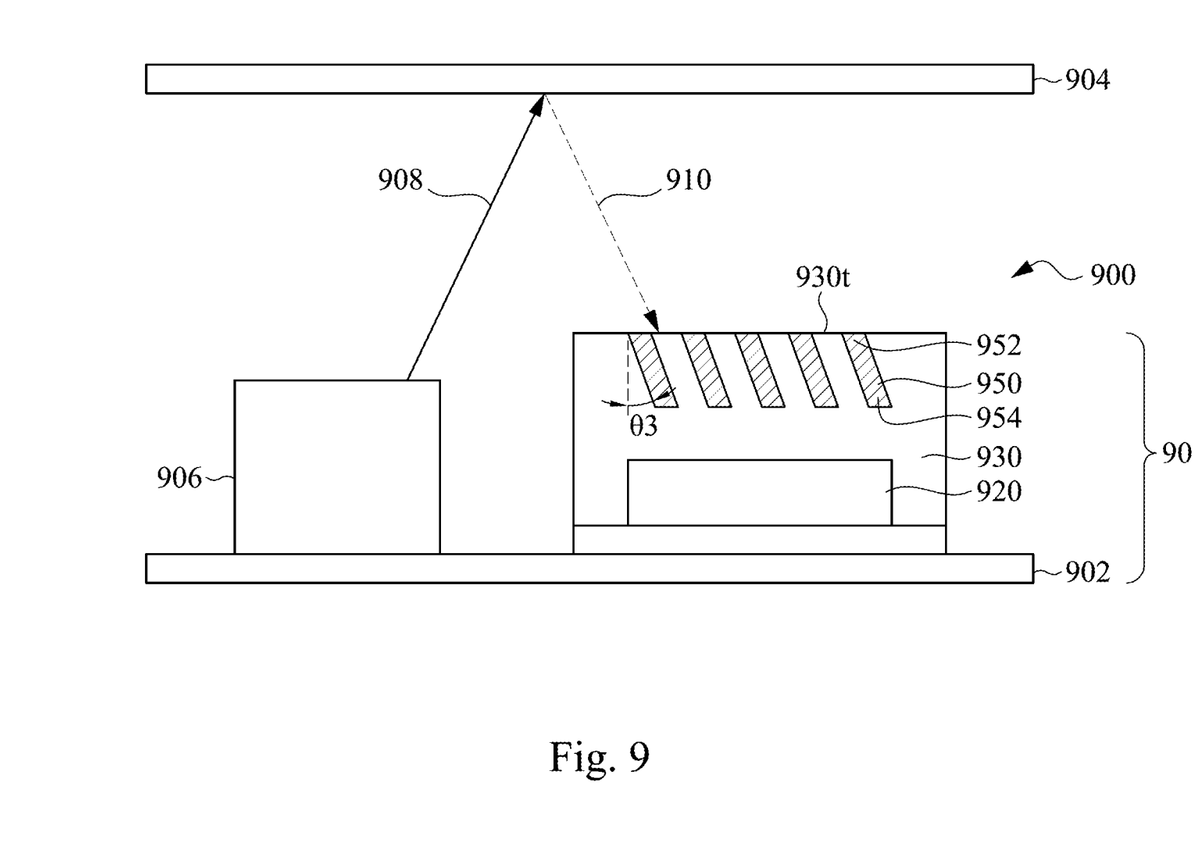
FIG. 9 is a cross-sectional view of a wearable device according to another embodiment of the disclosure.

FIG. 9 illustrates a cross-sectional view of a wearable device according to another embodiment of the disclosure. A photodiode package structure 900 with the shutters 950 on a carrier 902 is provided as a part of the wearable device 90. A light source 906 is also provided on the carrier 902 on the left side of the photodiode package structure 900. The photodiode package structure 900 is similar to the photodiode package structure 300 in FIG. 3, in which the shutters 950 are left-rotated with an angle 83. In other words, each of the shutters 950 includes a first end 952 close to the top surface 930t of the seal member 930, and the first end 952 inclines toward the light source 906. Each of the shutters 950 also includes a second end 954 away from the top surface 930t of the seal member 930, and the second end 954 inclines away the light source 906.

The light 908 emitted from the light source 906 is reflected by a plane 904 and forms the light 910. As shown in FIG. 9, the light 910 is from the left side of photodiode package structure 900 and is able to penetrate between the shutters 950. In other words, the light 910 with a small angle between the light 910 and the direction of the shutters 950 is able to be received by the photodiode chip 920. In the contrary, the light with a large angle between the light and the direction of the shutters 950 is blocked by the shutters 950, for example, the light from the right side of the photodiode package structure 900.

The value of the angle 83 may be determined by the distance between the light source 906 and the photodiode package structure 900. When the distance between the light source 906 and the photodiode package structure 900 is smaller, the light emitted from the light source 906 and reflected by the plane 904 will be more perpendicular to the top surface 930t of the seal member 930. Therefore, the angle 83 is smaller to allow more light 910 to reach the photodiode chip 920. In the contrary, the larger distance between the light source 906 and the photodiode package structure 900 leads to a larger angle 83. In some embodiments, the angle 83 may be in a range of 0° to 30°.

Figure 10:
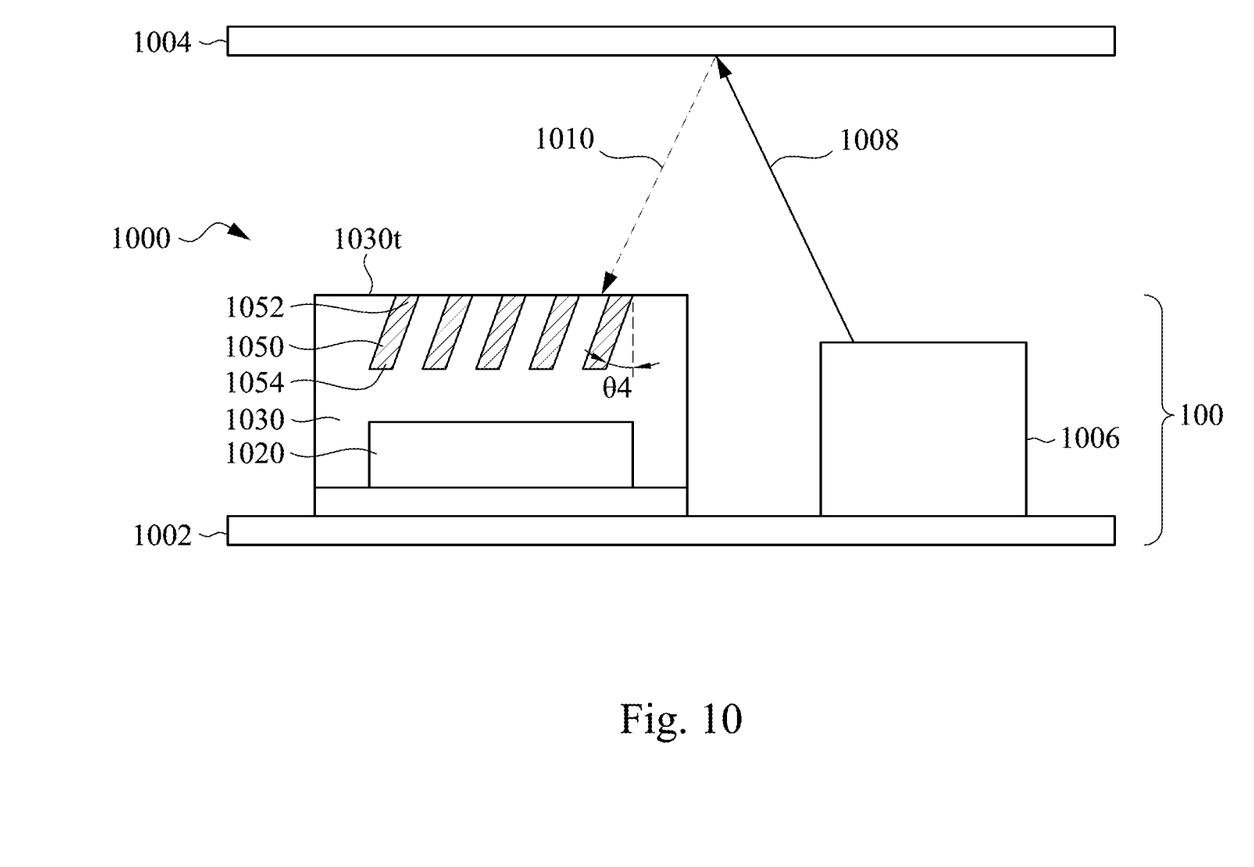
FIG. 10 is a cross-sectional view of a wearable device according to another embodiment of the disclosure.

FIG. 10 illustrates a cross-sectional view of a wearable device according to another embodiment of the disclosure. A photodiode package structure 1000 with the shutters 1050 on a carrier 1002 is provided as a part of the wearable device 10. A light source 1006 is also provided on the carrier 1002 on the right side of the photodiode package structure 1000. The photodiode package structure 1000 is similar to the photodiode package structure 200 in FIG. 2, in which the shutters 1050 are right-rotated with an angle 84. In other words, each of the shutters 1050 includes a first end 1052 close to the top surface 1030t of the seal member 1030, and the first end 1052 inclines toward the light source 1006. Each of the shutters 1050 also includes a second end 1054 away from the top surface 1030t of the seal member 1030, and the second end 1054 inclines away the light source 1006.

The light 1008 emitted from the light source 1006 is reflected by a plane 1004 and forms the light 1010. As shown in FIG. 10, the light 1010 is from the right side of photodiode package structure 1000 and is able to penetrate between the shutters 1050. In other words, the light 1010 with a small angle between the light 1010 and the direction of the shutters 1050 is able to reach the photodiode chip 1020. In the contrary, the light with a large angle between the light and the direction of the shutters 1050 is blocked by the shutters 1050, for example, the light from the left side of the photodiode package structure 1000.

The value of the angle 84 may be determined by the distance between the light source 1006 and the photodiode package structure 1000. Similar to the above description related to FIG. 9, the angle 84 is smaller when the distance between the light source 1006 and the photodiode package structure 1000 is smaller. In the contrary, the larger distance between the light source 1006 and the photodiode package structure 1000 leads to a larger angle 84. In some embodiments, the angle 84 may be in a range of 0° to 30°.

According to some embodiment of the disclosure, a photodiode package structure with shutters embedded in the seal member is provided. The rotated angle of the shutters may depend on the position of the light source or the distance between the light source and the photodiode package structure. The shutters above the photodiode chip in the photodiode package structure block portions of the light to avoid misdetection of the undesired light by the photodiode chip. Therefore, the disclosed photodiode package structure in a wearable device may decrease the error of calculation caused by the undesired light that reaches the wearable device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A photodiode package structure, comprising:
    a substrate;
    a photodiode chip on the substrate;
    a plurality of shutters above the photodiode chip; and
    a seal member covering the substrate and the photodiode chip, wherein the shutters are embedded in the seal member,
    wherein each of the shutters comprises a first end close to a top surface of the seal member and a second end away from the top surface of the seal member, the first end inclines toward the light source, and the second end inclines away the light source.

2. The photodiode package structure of claim 1, wherein the shutters comprise a top surface coplanar with a top surface of the seal member.

3. The photodiode package structure of claim 1, wherein the shutters comprise a non-transparent UV resin, a non-transparent plastic material, or a non-transparent metal.

4. The photodiode package structure of claim 3, wherein the non-transparent UV resin comprises acrylate resin or epoxy resin.

5. The photodiode package structure of claim 1, wherein an angle is defined between the shutters and a vertical direction of a top surface of the seal member, and the angle is 0° to 30°.

6. The photodiode package structure of claim 1, wherein a height of each of the shutters is in a range of 0.1 mm to 0.5 mm.

7. The photodiode package structure of claim 1, wherein a width of each of the shutters is in a range of 20 μm to 50 μm.

8. The photodiode package structure of claim 1, wherein a space between adjacent two of the shutters is in a range of 0.1 mm to 0.5 mm.

9. The photodiode package structure of claim 1, wherein a gap between the shutters and the photodiode chip is in a range of 0.1 mm to 0.5 mm.

10. A method of forming photodiode package structure, comprising:
    providing a substrate;
    disposing a photodiode chip on the substrate;
    forming a seal member covering the photodiode chip and the substrate, wherein the seal member comprises a plurality of trenches above the photodiode chip;
    forming a non-transparent layer on the seal member and in the trenches;
    curing the non-transparent layer; and
    removing portions of the non-transparent layer on a top surface of the seal member, wherein remained portions of the non-transparent layer in the trenches form a plurality of shutters above the photodiode chip,
    wherein each of the shutters comprises a first end close to a top surface of the seal member and a second end away from the top surface of the seal member, the first end inclines toward the light source, and the second end inclines away the light source.

11. The method of claim 10, wherein forming the seal member further comprises:
forming a flat transparent sealing material covering the photodiode chip and the substrate; and
cutting the flat transparent sealing material to form the trenches above the photodiode chip.

12. The method of claim 11, wherein cutting the flat transparent sealing material comprises cutting the flat transparent sealing material with a blade.

13. The method of claim 10, wherein forming the seal member further comprises:
placing the photodiode chip and the substrate in a mold;
injecting a transparent sealing material in the mold; and
removing the mold.

14. The method of claim 13, wherein the mold comprises a plurality of comb teeth corresponding to the trenches above the photodiode chip.

15. The method of claim 10, wherein forming the seal member comprises forming the trenches in the seal member with an angle between the trenches and a vertical direction of the top surface of the seal member, and the angle is 0° to 30°.

16. The method of claim 10, wherein curing the non-transparent layer comprises curing the non-transparent layer by a UV light source.

17. A wearable device, comprising:
a carrier;
a light source on the carrier; and
a photodiode package structure adjacent to the light source on the carrier, wherein the photodiode package structure comprises a photodiode chip, a seal member covering the photodiode chip, and a plurality of shutters embedded in the seal member above the photodiode chip,
wherein each of the shutters comprises a first end close to a top surface of the seal member and a second end away from the top surface of the seal member, the first end inclines toward the light source, and the second end inclines away the light source.

18. The wearable device of claim 17, wherein an angle is defined between the shutters and a vertical direction of a top surface of the seal member, and the angle is 0° to 30°.

19. The wearable device of claim 17, wherein each of the shutters comprises a first end coplanar with a top surface of the seal member.

* * * * *